United States Patent [19]

Watanabe et al.

[11] Patent Number: 4,725,456

[45] Date of Patent: Feb. 16, 1988

[54] METHOD FOR PREPARING MIXTURE TO BE USED FOR PRODUCTION OF COMPOSITE MATERIAL

[75] Inventors: Tadahiko Watanabe; Kazuhisa Shobu, both of Tosu, Japan

[73] Assignee: Agency of Industrial Science and Technology, Tokyo, Japan

[21] Appl. No.: 843,600

[22] Filed: Mar. 25, 1986

[30] Foreign Application Priority Data

Mar. 28, 1985 [JP] Japan .................................. 60-65867

[51] Int. Cl.$^4$ ..................... C23C 16/30; C23C 16/32
[52] U.S. Cl. .................................. 427/248.1; 427/215; 427/217; 427/249; 427/255; 427/255.2; 427/255.3
[58] Field of Search .................. 427/248.1, 255, 255.2, 427/255.3, 255.4, 314, 249, 212, 215, 216, 301, 237, 217, 304

[56] References Cited

U.S. PATENT DOCUMENTS

| | | | |
|---|---|---|---|
| 2,853,398 | 9/1958 | Mackiw et al. | 427/217 |
| 3,476,640 | 11/1969 | Sirtl et al. | 427/255 |
| 3,658,577 | 4/1972 | Wakefield | 427/255.2 |
| 4,050,951 | 9/1977 | Piccolo et al. | 427/255 |
| 4,241,112 | 12/1980 | Kostandov et al. | 427/215 |
| 4,330,573 | 5/1982 | Kostandov et al. | 427/255 |
| 4,353,938 | 10/1982 | Sterling et al. | 427/255.2 |
| 4,382,997 | 5/1983 | Henslee et al. | 427/255 |
| 4,459,338 | 7/1984 | Angelini et al. | 427/255 |
| 4,501,777 | 2/1985 | Rose | 427/255.2 |
| 4,508,682 | 4/1985 | Miura et al. | 427/255.2 |
| 4,565,747 | 1/1986 | Nakae et al. | 427/255.2 |

OTHER PUBLICATIONS

Bachem, "Deposition Process for $Al_xGa_{1-x}As$", IBM Technical Disclosure Bulletin, vol. 19, No. 3, Aug. 1976.

Primary Examiner—Sadie L. Childs
Attorney, Agent, or Firm—Oblon, Fisher, Spivak, McClelland & Maier

[57] ABSTRACT

Disclosed herein is a method for preparing a homogenized mixture of fine powders of heterogeneous substances or of fine powder and a fibrous component or whiskers, for use as a starting material in the production of a composite metallic material or a composite ceramic material. The invention utilizes chemical vapor deposition which ensures extremely high permeation into narrow spaces in producing whiskers or fine particles, the reaction product of the chemical vapor deposition, in the gaps between individual particles of fine powder or forming coated layers of the reaction product on the surfaces of powder particles to obtain a homogenized mixture of the fine powder and the reaction product.

9 Claims, 2 Drawing Figures

METHOD FOR PREPARING MIXTURE TO BE USED FOR PRODUCTION OF COMPOSITE MATERIAL

BACKGROUND OF THE INVENTION

1. Field of the Invention

This invention relates to a method for preparing a homogenized mixture of fine powders of heterogeneous substances or of fine powder and a component in the form of whiskers or the like, for use as a starting material in the production of a composite metallic or ceramic material.

2. Description of the Prior Art

In the production of a composite material consisting of two or more heterogeneous substances, it has been the general practice to prepare a mixture of powdery component materials by mechanical mixing. The same method is restored to even when the composite material includes a fibrous component or whiskers.

However, the mechanical mixing of such materials involves the following problems.

In case the components to be mixed are in the form of extremely fine particles, which can be smaller than 0.1 μm in diameter in some cases, it takes a very long time to mix them uniformly due to coagulation of fine particles which makes the mixing difficult. The uniform mixing becomes more difficult when one component is in the form of fibre or whiskers which are easily entangled with each other.

Consequently, the resulting composite material contains local irregularities in strength and properties, failing to make the most of the advantages which would accrue from the use of fine powder or fibre or whiskers.

Further, ultra-fine powder or ultra-fine whiskers which are generally susceptible to oxidation or other chemical reactions, giving rise to various problems or inconveniences in handling, for example, storage or mixing in vacuum or in an inert gas.

SUMMARY OF THE INVENTION

In order to eliminate the above-mentioned problems or difficulties, the present invention has as its object the provision of a method for making a uniform mixture of heterogeneous materials in the form of fine powder or fibre or whiskers by means of chemical vapor deposition (hereinafter referred to as "CVD" for brevity) which has extremely high permeation into narrow spaces.

Namely, it is an object of the present invention to provide a method of uniformly mixing heterogeneous components in the form of fine powder, fibre or whisker which are normally difficult to mix uniformly, based on the recognition that CVD reaction is extremely effective for forming a homogenized mixture by producing one component in internal interstices of another component of powdery, fibrous or whisker form.

It is another object of the present invention to provide a method for forming a homogenized mixture to be used in the production of a composite material, by CVD to form whiskers or fine particles of one component as a reaction product of CVD or to form coating layers of one component on particles of another component thereby selectively producing the reaction product in small gaps between individual particles or on individual particles, in order to obtain a composite material which effectively possesses the properties of the reaction product.

In accordance with the present invention, the above-mentioned objects are achieved by a method which essentially comprises the steps of: charging powder of one component into a CVD apparatus; and heating the powder to a CVD gas reaction temperature while passing a CVD gas therethrough to form whiskers or fine particles in the gaps of powder particles as a reaction product or to form coating layers of the reaction product on the surfaces of powder particles to obtain a homogenized mixture of the powder and the reaction product.

The powder to be charged into a CVD apparatus according to the method of the invention may be compressed into a compacted form beforehand within a range which retains its gas permeability. There are no particular restrictions with regard to the kind of the catalyst which is selected in connection with the material or materials which constitute the powder or compact, the composition of the CVD gas, the substance to be produced by CVD reaction, and the shape of the reaction product (whiskers, fine particles or coating layers). In this regard, a suitable combination is selected arbitrarily from the known ones.

For example, the powder to be charged into a CVD apparatus may be metallic or ceramic powder which can endure the CVD gas reaction temperature and which is inert to the CVD gas. With regard to the catalyst for producing whiskers, it has been known that Ni, Pd, Pt, Ag, Si and the like are effective for growing TiN whiskers at 900°–1250° C., and Ni, Pd and Pt are effective for growing whiskers of TiC and ZrC. A suitable catalyst or catalysts may be selectively admixed into the powder. As one method for adding Pd as a catalyst, it is possible to immerse the powder in a PdCl solution as a pretreatment stage for electroless plating, followed by drying.

According to the above-mentioned method of the present invention, a homogenized mixture of fine powders or a uniform mixture of fine powder and whiskers can be formed easily, with a wide variety of selections with regard to the kinds of the materials to be mixed and the shape of the substance to be formed by CVD, including fine particles, whiskers and coating layers. Therefore, the composite material which is produced from a mixture prepared by the method of the present invention suitably possesses the properties accruing from the use of fine powder or whiskers.

Although ultra-fine particles or whiskers are susceptible to oxidation or other chemical reactions as mentioned hereinbefore, the method of the invention involves no difficulties or inconveniences in handling since they are treated in a non-invasive gas.

The mixture obtained by the method of the invention for use as a starting material of a composite material can find various applications, and is especially effective for strengthening ceramic materials to permit to use ceramics as mechanical structures.

DESCRIPTION OF PREFERRED EMBODIMENTS

Figure 1:
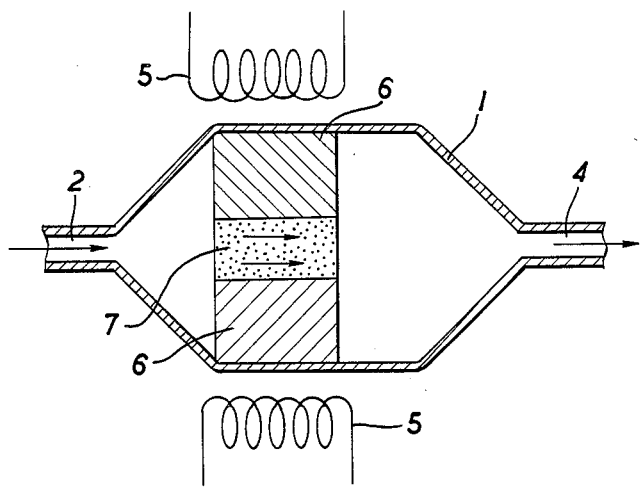
FIGS. 1 and 2 are sectional views of apparatus employed for carrying out the method of the invention.
Figure 2:
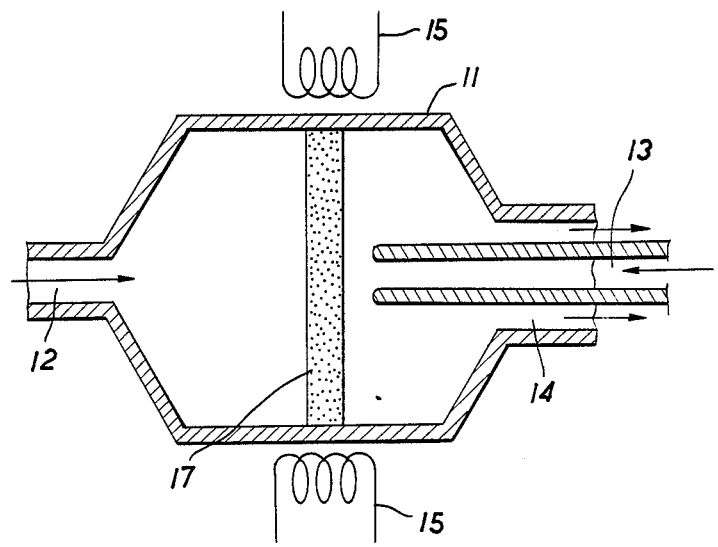

Referring to FIGS. 1 and 2, there are shown examples of CVD apparatus suitable for carrying out the method of the invention. The CVD apparatus of FIG. 1 is constituted by a reaction vessel 1 having an inlet 2 and an outlet 4, a heater 5 located around the reaction vessel 1 for heating the interior of the vessel to a CVD gas reaction temperature, and a material holder 6 with a gas passage or passages to hold a material 7 in the form of compacted powder in the reaction vessel 1. On the other hand, the CVD apparatus of FIG. 2 is constituted by a reaction vessel 11 with first and second gas inlets 12 and 13 at the opposite ends and a gas outlet 13 around the second gas inlet 13, and a heater located around the vessel to heat its interior, holding a compacted powder material 17 in the gas passage in the reaction vessel 11.

[EXAMPLE 1]

In a pretreatment, $Si_3N_4$ powder, dried after immersion in a PdCl solution was compressed to form a gas permeable compact, and the resulting compact was placed in a reaction vessel 1 of a CVD apparatus as shown in FIG. 1. A mixture gas of $TiCl_4$, $N_2$ and $H_2$ was passed through the reaction vessel 1 which was kept at 1150° C. by the heater 5.

The proportions of $TiCl_4$, $N_2$ and $H_2$ in the mixture gas were controlled to 2%, 49% and 49%, respectively, while maintaining the flow rate of the mixture at 100 cc/min for 2 hours. Thereafter, the sample material 7 was taken out for examination. As a result, there was obtained a mixture of $Si_3N_4$ and TiN, with the gap spaces between the $Si_3N_4$ particles densely packed with TiN whiskers.

The reaction involved in this case was

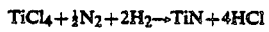

$$TiCl_4 + \tfrac{1}{2}N_2 + 2H_2 \rightarrow TiN + 4HCl$$

The product TiN was grown in the form of whiskers by the catalytic action of Pd which was brought into the system in the stage of pretreatment.

[EXAMPLE 2]

A sample material was prepared by uniformly mixing 10 wt % of fine Ni powder into SiC powder and compressing the resulting mixture. The sample material was placed in a reaction vessel of a CVD apparatus as shown in FIG. 2, and $TiCl_4$, $N_2$ and $H_2$ gases were passed therethrough while maintaining the temperature in the reaction vessel 11 at 1200° C. In order to adjust the site of reaction in the sample material, $TiCl_4$ and $H_2$ gases were admitted through the first gas inlet 12 while introducing $N_2$ gas from the opposite direction through the second gas inlet 13. The flow rates of $TiCl_4$, $N_2$ and $H_2$ gases were controlled in average to 10 cc/ min, 20 cc/min and 200 cc/min, respectively, and maintained for 20 minutes. Thereafter, the sample material was taken out for examination. As a result, there was obtained a mixture of SiC and TiN, with the gap spaces between SiC particles filled with TiN whiskers. The reaction took place at the meeting point the gases flowing in opposite directions so that the site of reaction was adjusted by varying the flow rate and velocity of $N_2$ gas for shifting the meeting point.

The reaction involved in this case was

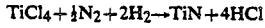

$$TiCl_4 + \tfrac{1}{2}N_2 + 2H_2 \rightarrow TiN + 4HCl$$

The product TiN was grown into whiskers by the catalytic action of Ni powder.

[EXAMPLE 3]

$ZrO_2$ powder was compressed to form a gas permeable sample material, and placed in a CVD apparatus as shown in FIG. 2 similarly to Example 2, heating the temperature in the reaction vessel 11 to 1100° C. Nextly, $TiCl_4$ and $O_2$ gases which were preheated to 1000° C. were admitted into the reaction vessel 11 from opposite directions through the first and the second gas inlet 12 and 13 for 30 minutes. Thereafter, the sample material 17 was taken out for examination. As a result, it was observed that the gap spaces between the $ZrO_2$ particles were uniformly filled with fine $TiO_2$ particles.

The reaction involved in this case was

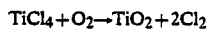

$$TiCl_4 + O_2 \rightarrow TiO_2 + 2Cl_2$$

[EXAMPLE 4]

$MoSi_2$ powder was compressed to obtain a gas permeable sample material, and it was placed in a CVD apparatus as shown in FIG. 2. Thereafter, $TiCl_4$, $H_2$ and $N_2$ gases were admitted into the reaction vessel in the same manner as in Example 2 at the flow rates of 10 cc/min, 200 cc/min and 20 cc/min, respectively, while heating and retaining the sample material at 1300° C. for 30 minutes. Then, the sample material 17 was taken out for examination, which revealed that $MoSi_2$ particles were coated with TiN.

What is claimed is:

1. A method of preparing a homogeneous mixture of a powder of the principal constituent and whiskers that serves as a starting material for the production of a composite material containing whiskers which comprises the steps of:
   charging the powder compacted to such an extent so as to retain gas permeability and containing an amount of catalyst effective to cause growth of the whiskers into a chemical vapor deposition apparatus;
   passing a chemical vapor deposition gas through the chemical vapor deposition apparatus while heating the powder to a temperature at which the chemical vapor deposition gas reacts to cause precipitation; and
   thereby causing the whiskers to form as a product of reaction in the interstices of the powder.

2. The method according to claim 1, in which the powder charged in the chemical vapor deposition apparatus is a metal powder that withstands the temperature at which the chemical vapor deposition gas reacts to cause precipitation and remains unreactive with the chemical vapor deposition gas.

3. The method according to claim 1, in which the powder charged in the chemical vapor deposition apparatus is a powder of ceramics that does not react with the chemical vapor deposition gas.

4. The method according to claim 1, in which the catalyst is mixed with the powder to be charged in the chemical vapor deposition apparatus.

5. The method according to claim 1, in which the catalyst is electroless plated onto the powder to be charged in the chemical vapor deposition apparatus.

6. The method according to claim 4, in which the whiskers formed are those of TiN and they are caused to form by heating the powder charged in the chemical vapor deposition apparatus at a temperature of 900° C. to 1250° C., using an element selected from the group consisting of nickel, palladium, platinum, silver and silicon as the catalyst to cause the growth of the whiskers.

7. The method according to claim 4, in which the catalyst is effective to cause the growth of whiskers of TiC and is selected from the group consisting of nickel, palladium and platinum.

8. The method according to claim 4, in which the catalyst is effective to cause the growth of whiskers of ZrC and is selected from the group consisting of nickel, palladium and platinum.

9. The method according to claim 5, in which the powder to be charged into the chemical vapor deposition apparatus is preliminarily electroless plated with palladium in a solution of palladium monochloride.

* * * * *